(12) United States Patent
Salmon

(10) Patent No.: US 7,586,747 B2
(45) Date of Patent: Sep. 8, 2009

(54) SCALABLE SUBSYSTEM ARCHITECTURE HAVING INTEGRATED COOLING CHANNELS

(75) Inventor: Peter C. Salmon, Mountain View, CA (US)

(73) Assignee: Salmon Technologies, LLC., Mountain View, CA (US)

( * ) Notice: Subject to any disclaimer, the term of this patent is extended or adjusted under 35 U.S.C. 154(b) by 88 days.

(21) Appl. No.: 11/495,954

(22) Filed: Jul. 27, 2006

(65) Prior Publication Data

US 2007/0025079 A1    Feb. 1, 2007

Related U.S. Application Data

(60) Provisional application No. 60/704,774, filed on Aug. 1, 2005.

(51) Int. Cl.
*H05K 7/20*    (2006.01)

(52) U.S. Cl. .................. 361/699; 361/715; 361/790; 257/714; 165/80.4

(58) Field of Classification Search ................ None
See application file for complete search history.

(56) References Cited

U.S. PATENT DOCUMENTS

| | | | |
|---|---|---|---|
| 4,455,654 A | 6/1984 | Bhaskar et al. ............... 714/28 |
| 4,748,495 A | 5/1988 | Kucharek ................... 257/713 |
| 4,862,322 A | 8/1989 | Bickford et al. ............. 361/718 |
| 4,912,844 A | 4/1990 | Parker ......................... 29/848 |
| 4,997,791 A | 3/1991 | Ohuchi et al. ............... 437/209 |
| 5,001,548 A | 3/1991 | Iversen ....................... 257/714 |
| 5,070,297 A | 12/1991 | Kwon et al. ................ 324/754 |
| 5,159,529 A | 10/1992 | Lovgren ..................... 361/699 |
| 5,162,974 A | 11/1992 | Currie ......................... 361/702 |
| 5,214,250 A | 5/1993 | Cayson et al. ................ 438/73 |
| 5,239,200 A | 8/1993 | Messina et al. ............. 257/714 |
| 5,239,448 A | 8/1993 | Perkins et al. .............. 361/764 |
| 5,267,867 A | 12/1993 | Agahdel et al. ............... 439/73 |
| 5,281,151 A | 1/1994 | Arima et al. .................. 439/68 |
| 5,290,970 A | 3/1994 | Currie ......................... 174/250 |
| 5,291,064 A | 3/1994 | Kurokawa ................... 257/714 |
| 5,300,810 A * | 4/1994 | Eden .......................... 257/686 |
| 5,305,184 A | 4/1994 | Andresen et al. ............ 361/699 |

(Continued)

FOREIGN PATENT DOCUMENTS

JP          07169873 A       7/1995

OTHER PUBLICATIONS

Chow, Eugene M. et al., "Process Compatible Polysilicon-Based Electrical Through-Wafer Interconnects in Silicon Substrates", Journal of Microelectromechanical Systems, vol. 11, No. 6, Dec. 2002, pp. 631-640.

(Continued)

*Primary Examiner*—Boris L Chervinsky
(74) *Attorney, Agent, or Firm*—Dorsey & Whitney LLP

(57) ABSTRACT

A method for building scalable electronic subsystems is described. Stackable modules employ copper substrates with solder connections between modules, and a ball grid array interface is provided at the bottom of the stack. A cooling channel is optionally provided between each pair of modules. Each module is re-workable because all integrated circuit attachments within the module employ re-workable flip chip connectors. Also, defective modules can be removed from the stack by directing hot inert gas at externally accessible solder connections.

15 Claims, 15 Drawing Sheets

U.S. PATENT DOCUMENTS

| | | | |
|---|---|---|---|
| 5,334,279 A | 8/1994 | Gregoire | 216/20 |
| 5,367,593 A | 11/1994 | Lebby et al. | 385/53 |
| 5,390,412 A | 2/1995 | Gregoire | 29/848 |
| 5,451,722 A | 9/1995 | Gregoire | 174/261 |
| 5,461,327 A | 10/1995 | Shibata et al. | 324/760 |
| 5,510,758 A | 4/1996 | Fujita et al. | 333/247 |
| 5,579,574 A | 12/1996 | Colleran et al. | 29/840 |
| 5,627,406 A | 5/1997 | Pace | 257/700 |
| 5,635,767 A | 6/1997 | Wenzel et al. | 257/778 |
| 5,640,051 A | 6/1997 | Tomura et al. | 257/778 |
| 5,701,666 A | 12/1997 | DeHaven et al. | 29/831 |
| 5,736,850 A | 4/1998 | Legal | 324/158.1 |
| 5,774,475 A | 6/1998 | Qureshi | 714/726 |
| 5,786,986 A * | 7/1998 | Bregman et al. | 361/719 |
| 5,797,771 A | 8/1998 | Garside | 439/610 |
| 5,800,060 A | 9/1998 | Speckbrock et al. | 374/104 |
| 5,847,936 A | 12/1998 | Forehand et al. | 361/794 |
| 5,900,738 A | 5/1999 | Khandros et al. | 324/761 |
| 5,959,462 A | 9/1999 | Lum | 324/765 |
| 5,972,152 A | 10/1999 | Lake et al. | 156/247 |
| 5,986,887 A * | 11/1999 | Smith et al. | 361/704 |
| 5,998,738 A | 12/1999 | Li et al. | 174/250 |
| 6,005,198 A | 12/1999 | Gregoire | 174/262 |
| 6,103,554 A | 8/2000 | Son et al. | 438/126 |
| 6,121,676 A | 9/2000 | Solberg | 257/686 |
| 6,138,348 A | 10/2000 | Kulesza et al. | 29/840 |
| 6,161,921 A | 12/2000 | Bard et al. | 347/55 |
| 6,174,804 B1 | 1/2001 | Hsu | 438/238 |
| 6,208,511 B1 | 3/2001 | Bortolini et al. | 361/698 |
| 6,210,229 B1 | 4/2001 | Lai | 439/610 |
| 6,225,688 B1 | 5/2001 | Kim et al. | 257/686 |
| 6,246,010 B1 | 6/2001 | Zenner et al. | 174/260 |
| 6,304,447 B1 | 10/2001 | Bortolini et al. | 361/699 |
| 6,310,484 B1 | 10/2001 | Akram et al. | 324/764 |
| 6,372,549 B2 | 4/2002 | Urushima | 438/118 |
| 6,392,301 B1 | 5/2002 | Waizman et al. | 257/774 |
| 6,416,171 B1 | 7/2002 | Schmidlin | 347/55 |
| 6,441,476 B1 | 8/2002 | Emoto | 257/686 |
| 6,460,247 B1 | 10/2002 | Gregoire | 29/848 |
| 6,462,532 B1 | 10/2002 | Smith | 324/158.1 |
| 6,476,885 B1 | 11/2002 | Murray et al. | 349/60 |
| 6,480,395 B1 * | 11/2002 | Kopf | 361/760 |
| 6,515,870 B1 | 2/2003 | Skinner et al. | 361/800 |
| 6,528,891 B2 | 3/2003 | Lin et al. | 257/778 |
| 6,531,022 B1 * | 3/2003 | Tsukahara | 156/256 |
| 6,587,345 B2 | 7/2003 | Chu et al. | 361/719 |
| 6,611,057 B2 * | 8/2003 | Mikubo et al. | 257/714 |
| 6,631,344 B1 | 10/2003 | Kapur et al. | 703/22 |
| 6,677,776 B2 | 1/2004 | Doherty et al. | 324/765 |
| 6,683,377 B1 | 1/2004 | Shim et al. | 257/723 |
| 6,690,845 B1 | 2/2004 | Yoshimura et al. | 385/14 |
| 6,717,812 B1 * | 4/2004 | Pinjala et al. | 361/699 |
| 6,722,893 B2 | 4/2004 | Li et al. | 439/66 |
| 6,749,587 B2 | 6/2004 | Flaherty | 604/151 |
| 6,763,880 B1 | 7/2004 | Shih | 165/80.4 |
| 6,784,554 B2 | 8/2004 | Kajiwara et al. | 257/778 |
| 6,829,574 B1 * | 12/2004 | Ito et al. | 703/28 |
| 6,845,477 B2 | 1/2005 | Hidaka | 714/729 |
| 6,880,350 B2 | 4/2005 | Tilton | 62/171 |
| 6,881,609 B2 | 4/2005 | Salmon | |
| 6,891,732 B2 | 5/2005 | Takano et al. | 361/783 |
| 6,927,471 B2 | 8/2005 | Salmon | 257/499 |
| 6,938,678 B1 | 9/2005 | Bortolini et al. | 165/80.4 |
| 6,942,493 B2 | 9/2005 | Matsunaga et al. | 439/66 |
| 6,955,063 B2 | 10/2005 | Adiga et al. | 62/259.2 |
| 6,956,284 B2 | 10/2005 | Cady et al. | 257/685 |
| 6,956,285 B2 | 10/2005 | Radu et al. | 257/697 |
| 6,973,717 B2 | 12/2005 | Hacke et al. | 29/840 |
| 6,990,176 B2 | 1/2006 | Sherman et al. | 378/98.8 |
| 7,009,412 B2 | 3/2006 | Chong et al. | 324/754 |
| 7,018,917 B2 | 3/2006 | Elers | 438/622 |
| 7,040,383 B2 | 5/2006 | Oyamada | 165/104.33 |
| 7,078,926 B2 | 7/2006 | Khandros et al. | 324/765 |
| 7,163,830 B2 | 1/2007 | Salmon et al. | 438/18 |
| 7,180,165 B2 * | 2/2007 | Ellsberry et al. | 257/686 |
| 7,195,503 B2 | 3/2007 | Eldridge | 439/197 |
| 7,224,856 B2 | 5/2007 | Kathman et al. | 385/14 |
| 7,254,024 B2 | 8/2007 | Salmon | 361/699 |
| 2002/0030975 A1 | 3/2002 | Moon | 361/749 |
| 2002/0121689 A1 | 9/2002 | Honda | 257/700 |
| 2003/0035473 A1 | 2/2003 | Takinosawa | 375/224 |
| 2003/0106004 A1 | 6/2003 | Richetti et al. | 714/733 |
| 2003/0167144 A1 | 9/2003 | Wang et al. | 702/119 |
| 2003/0168725 A1 | 9/2003 | Warner et al. | 257/686 |
| 2004/0012383 A1 | 1/2004 | Kimura | 324/158.1 |
| 2004/0115340 A1 | 6/2004 | Griego | 427/98 |
| 2004/0148121 A1 | 7/2004 | deObaldia et al. | 702/117 |
| 2004/0176924 A1 | 9/2004 | Salmon | |
| 2005/0040513 A1 | 2/2005 | Salmon | 257/734 |
| 2005/0168231 A1 | 8/2005 | Kim | 324/754 |
| 2005/0184376 A1 | 8/2005 | Salmon | 257/686 |
| 2005/0255722 A1 | 11/2005 | Salmon | 439/67 |
| 2006/0077638 A1 | 4/2006 | Salmon | 361/704 |
| 2006/0131728 A1 | 6/2006 | Salmon | 257/698 |
| 2006/0145715 A1 | 7/2006 | Salmon | 324/754 |
| 2006/0209512 A1 | 9/2006 | Taniguchi et al. | 361/699 |
| 2007/0007983 A1 | 1/2007 | Salmon | 324/754 |
| 2007/0023889 A1 | 2/2007 | Salmon | 257/690 |
| 2007/0023904 A1 | 2/2007 | Salmon | 385/49 |
| 2007/0023923 A1 | 2/2007 | Salmon | 257/296 |

OTHER PUBLICATIONS

Davis & Arledge, "Thin Film Metallization of Three Dimensional Substrates", Electronic Components Technology Conference, Proceedings 44th, May 1-4, 1994, pp. 359-361.

Gutmann, R.J. et al., "Wafer-Level Three-Dimensional Ics: A Better Solution Than SoCs and SiPs?", 6 pages.

Holden, Happy, "A Design Technology Innovation—The Power Mesh Architecture for PCBs", The Board Authority, Dec. 2000, pp. 2-6.

Kreider, Kenneth G. et al., "High Temperature Materials For Thin-Film Thermocouples On Silicon Wafers", Chemical Science and Technology Laboratory, NIST, Gaithersburg, Maryland, USA.

Sensu, Yoshihisa et al., "Study on Improved Resolution of Thick Film Resist (Verification by Simulation)", SPIE, 2001.

* cited by examiner

US 7,586,747 B2

SCALABLE SUBSYSTEM ARCHITECTURE HAVING INTEGRATED COOLING CHANNELS

This application claims priority to U.S. provisional patent application Ser. No. 60/704,774 filed Aug. 1, 2005, the entire contents of which are hereby incorporated herein by reference.

FIELD OF THE INVENTION

This invention relates to integration of semiconductor chips into electronic systems, and more particularly to a scalable subsystem having integrated cooling channels.

DESCRIPTION OF THE RELATED ART

Over the last 40 years transistor density in silicon integrated circuit (IC) chips has increased by a factor greater than 100,000; this phenomenon is known as Moore's Law. Meanwhile, the ability to integrate silicon chips into systems has progressed relatively slowly. Package development can be traced from printed circuit boards (PCBs) having plated through holes (PTHs) around 1970. Surface mount technology (SMT) has followed, also multi-chip modules (MCMs), and systems in package (SIPs). The slow rate of development of integration methods compared with silicon fabrication has resulted in an integration gap; this gap has dimensions of cost, performance, cooling, and scalability.

The 2003 International Technology Roadmap for Semiconductors (ITRS) shows packaging costs for microprocessor circuits exceeding chip costs in 2010. Digital IC chips can now operate at signaling rates of 10 Gbps while many packages do not support speeds greater than around 200 Mpbs. Cooling has become critical. Modern servers typically have bulky finned aluminum heat sinks surrounding each of the processors. This increases the volume of the server units with attendant cost increases and performance decreases. Recent microprocessor chips dissipate as much as 150 W each. Cooling costs for a 30,000 square foot data center are reported at $8 million per year. Scalability has not been much discussed at the system level, apart from providing servers in a blade form factor for higher packaging density and user convenience. Generally, system or subsystem scalability is difficult if multiple component types and packages are employed.

Electrical connections to an IC chip have typically occurred on the front side of the chip where the active circuits and bonding pads are located, while cooling has been provided at the back side. Thermal interface materials (TIMs) such as thermal grease have been used between the back side of the die and its heat sink. When thermal grease is used, it is typically the highest impedance element in the thermal path.

SUMMARY OF THE INVENTION

IC modules are described wherein IC chips are attached to interconnection substrates using flexible and re-workable pillar in well (PIW) attachments. Each interconnection substrate includes high density interconnect (HDI) circuits fabricated on a sheet of copper. A test chip is provided in each module so it can be tested and reworked as required. Modules are stacked to form scalable subsystems using ball grid array (BGA) connectors, with cooling channels provided optionally between each pair of modules. A gas or liquid coolant is circulated in the cooling channels.

BRIEF DESCRIPTION OF THE DRAWINGS

The foregoing and other objects of the invention will be more clearly understood from the accompanying drawings and description of the invention.

DETAILED DESCRIPTION OF THE PREFERRED EMBODIMENTS

Figure 1:
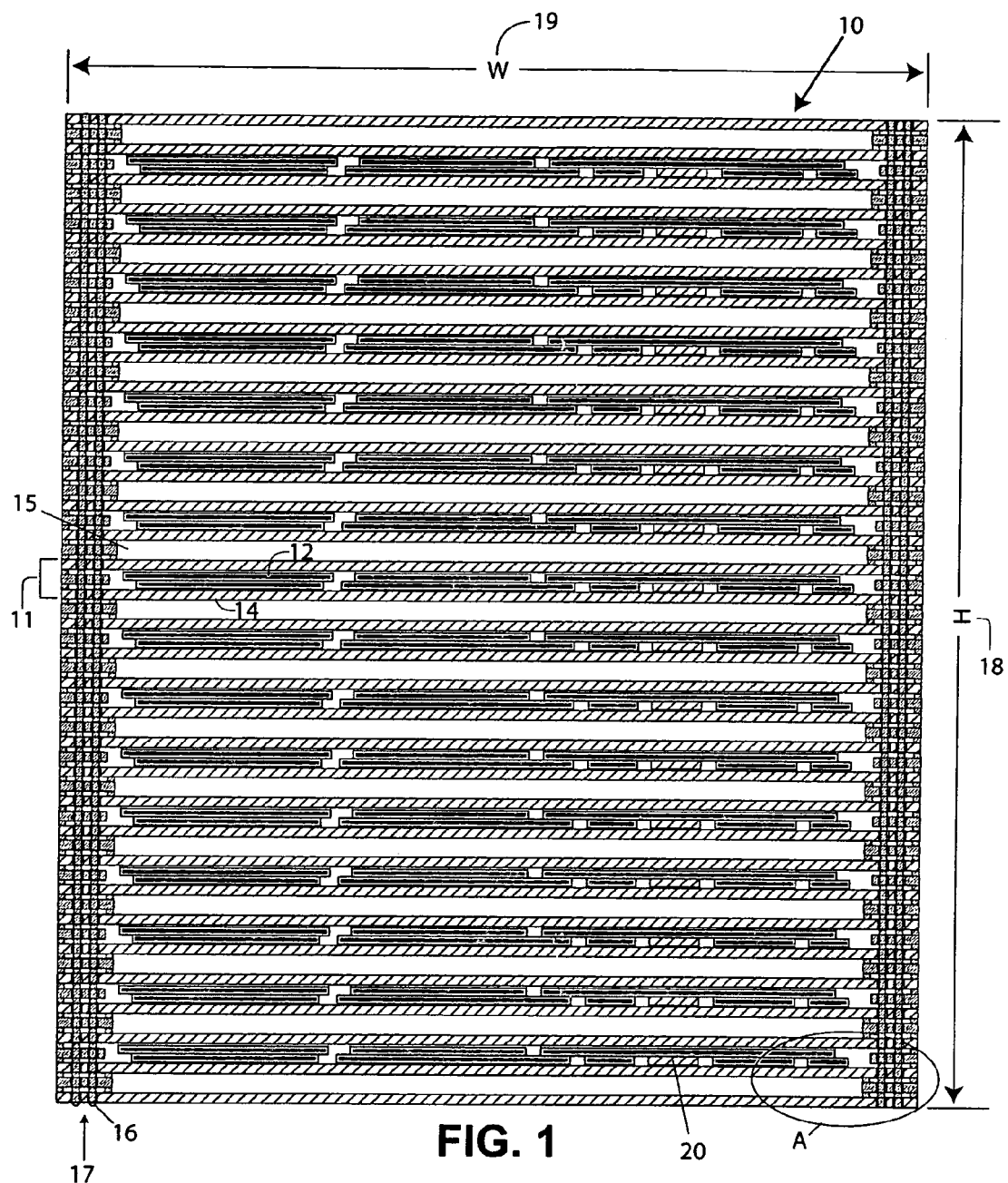
FIG. 1 is a cross-sectional view of a stacked subsystem of the current invention, including embedded cooling channels.

Various embodiments of the present invention are described hereinafter with reference to the figures. It should be noted that the figures are only intended to facilitate the description of specific embodiments of the invention. They are not intended as an exhaustive description of the invention or as a limitation on the scope of the invention. In addition, an aspect described in conjunction with a particular embodiment of the present invention is not necessarily limited to that embodiment and can be practiced in any other embodiments. For instance, the preferred embodiment describes cooling of the high power laser diodes in the electro-optic chip using heat bumps at the front face of the chip. However, additional cooling may be applied through the back face of the chip, using a thicker chip or a copper slug, as described relative to other circuit elements of the current invention.

A preferred embodiment of the current invention is a stacked system or subsystem employing modules comprising copper substrates and arrays of flipped chips, with inter-stack cooling channels provided between each pair of modules in the stack. Conventional system components such as PCBs and discrete packages are eliminated. The system is assembled from semiconductor chips and copper substrates having interconnection circuits fabricated thereon. Preferably all of the integrated circuit types including digital, analog, RF, integrated passives, optical, and electro-optical are provided on IC chips that attach using the same type of PIW connector.

The PIW connector employs a pillar or a bump inserted into a well filled with conductive material. It is described in U.S. Pat. No. 6,881,609 for the case of gold stud bumps and solder as the conductive material in the wells. The bumps are usually provided on the IC chips and the wells are provided on the substrate to which the chips are attached, although the reverse can also be employed. The current description of PIW employs a flexible copper pillar for the bump instead of a gold stud bump. The pillar is formed by electro-deposition as a thin wire-like element having flexibility for relieving stress at the interface between chip and substrate. By providing this stress relief using flexible pillars, columns, mesas, or bumps, the typical requirement for an epoxy under layer is avoided; this makes easy rework possible. Testing of known good die (KGD) can be accomplished at full power and full speed by filling the wells with a conductive dry powder. Modules including multiple chips can be assembled and tested in this temporary form of the final assembly, with convenient replacement of any chips that prove defective. For production units, a semi-permanent connection is made by heating the dry powder to form solder; this can be accomplished in one step for an entire subsystem assembly. Even the melted solder connections can be reworked if necessary. This is done be selectively applying heat to melt the solder attaching a defective component. The defective component is withdrawn from the wells, the remaining solder is sucked out of the wells, the wells are refilled and a replacement chip is attached. By using these temporary and semi-permanent connections, complex assemblies with 100 or more chips can be assembled with 100% assembly yield. This avoids rejection of modules or subsystems due to imperfect yield of the component chips. Thus a cost benefit is achieved for modules having up to approximately 6 chips where the compound yield is satisfactory, and an enabling technology is achieved for extending module complexity to modules having 100 chips or more, for example.

For complex flip chip assemblies it is difficult or impossible to test them at full power and full speed through a cable to an external test box. Use of a typical test connector and cable tends to negate the miniaturization advantages of flip chip. Also, it is difficult to drive and sense high speed signals through conventional cables and connectors due to their parasitic inductance and capacitance, particularly as chip technology progresses toward lower power supplies and reduced noise margins. For the systems described herein it is preferable to provide test chips resident in the modules; they will include high speed sampling circuits and comparators and an interface to a test support computer. This testing approach is described in co-pending U.S. patent application Ser. No. 10/448,611, and is incorporated herein in its entirety by reference.

The current invention provides an option for providing a mixed array of flip chip connectors at the interface between each chip and its underlying substrate. The mixed array provides both input/output (I/O) capabilities and heat sinking capabilities on the active (front) side of the IC chip. A regular array of bumps (pillars) can be formed in rows and columns to create a sea of bumps, of which selected ones are used for I/O, and the others are used for heat-sinking. Modern microprocessor chips may require 2,000 leads or more, combining both signal and power pins. The PIW connectors can be configured in a small size that will support digital signaling rates of around 20 Gbps.

FIG. 1 shows a stacked electronic assembly (subsystem) 10 of the current invention. Subsystem 10 includes hermetic modules 11 containing IC chips 12. Modules 11 at different levels in the stack may be similar to perform a similar function, or may be different to perform different functions. Modules 11 are preferably built on copper substrates 14 and are preferably separated by inter-stack cooling channels 15 through which a coolant may flow. Modules 11 and cooling channels 15 are preferably hermetically sealed (hermetic), to prevent any moisture reaching IC chips 12 as well as to contain the coolant without leakage. As examples, the coolant fluid may be air or water or liquid metal. Cooling channels 15 may be provided between each pair of modules 11, or may be selectively included between high power modules, and not included between low power modules. Subsystem 10 may interface with a PCB or other electronic component using solder balls 16 arranged to form a ball grid array (BGA). The BGA interface provides power and signal I/O to stacked assembly 10, and the stacked BGA connectors 17 provide distribution throughout subsystem 10. PIW connectors may be used in place of the BGA connectors, although a sealing type of connection is required to contain the coolant in cooling channels 15, and this is typically achieved using solder. Thus, a hybrid of PIW electrical connectors combined with solder-type sealing connections may be employed. A typical height H 18 for subsystem 10 including sixteen modules 11 is 60 mm with a typical width dimension W 19 of 50 mm. An example subsystem 10 may be a 64-way computer server wherein each module 111 contains around 80° C. chips and implements a 4-way server. The suite of IC chips within module 11 may include processors, I/O and legacy controllers, memory chips of various types (flash and DDR RAM for example), power distribution chips, one or more test chips, and integrated passives. Compared with servers that are currently available in a blade format (like the IBM HS40 which is a 4-way blade server), modules 11 are smaller and lighter by a factor of more than 100. As will be further explained, modules 11 and subsystem 10 are also testable and repairable, including repair of any chip in any module.

Subsystem 10 will be more reliable than conventional subsystems because of its electrical, mechanical, and thermal design. This is briefly described here in the context of FIG. 1 and further elaborated in the following paragraphs. A new type of flip chip connector (the PIW connector) is used to attach each of the I/O chips such as 12. A similar PIW connector is used for both I/O and for heat extraction. The PIW connector includes a slender copper column (bump) that is flexible enough to relieve shear stresses at the chip/substrate interface. The flexibility (compliance) of the copper column eliminates reliability issues such as cracking of the solder joints due to thermally induced mechanical stress. Also, epoxy under fill is not required and this is an important enabler of an effective rework strategy, for replacing a component that proves to be defective. The copper base plates provide a rugged mechanical design, yet compliance in the flexible copper bumps makes the modules resistant to vibration and shock damage. The thermal design includes options for cooling high thermal fluxes, to be further described. Tight control of junction temperatures leads to increased circuit reliability which is a strong function of peak operating temperature. Finally, by eliminating conventional cables and connectors, subsystem reliability is further improved.

The scalability of subsystem 10 is apparent from its modular construction; the stacking unit is a 4-way server in the preferred embodiment. It can be envisaged that a 256-way server would comprise a stack having four times the height of subsystem 10, for example. It is anticipated that such a 256-way server would require more I/O than a 64-way server; in this case the footprint may be increased, accommodating more I/O at the BGA interface. Since solder bumps and copper feedthroughs have high current capacity, the number of BGA connectors needed for distributing power may not need to increase, allowing the additional pins to be used for I/O. As an alternative solution that will accommodate high bandwidth signals, fiber optic communication ports will be described in reference to FIG. 4 through FIG. 8.

Compared with a typical electronic subsystem of today, the usual printed circuit boards and discrete packages have been eliminated. Subsystem 10 has been assembled from IC chips and copper substrates with interconnection circuits that will be further described. This requires that all circuit components be provided in the form of IC chips, including integrated devices like computing cores, memory chips, power distribution chips, and integrated passives, as well as discrete devices such as resistors, capacitors, inductors, power diodes and power transistors. It also requires innovations in test, assembly and rework, as will be further described. However, elimination of conventional packages and boards reduces cost. The board of the current invention can be viewed as the combination of a high density interconnection (HDI) circuit and a heat dissipation device. Other manufacturing cost advantages are achievable using new testing and rework methods, to be further described.

Because of their small size, the I/O connectors will have a low inductance of approximately 0.1 nH, and this will enable digital signaling rates of around 20 Gbps as well as RF connections operating at frequencies up to around 10 GHz.

Figure 2:
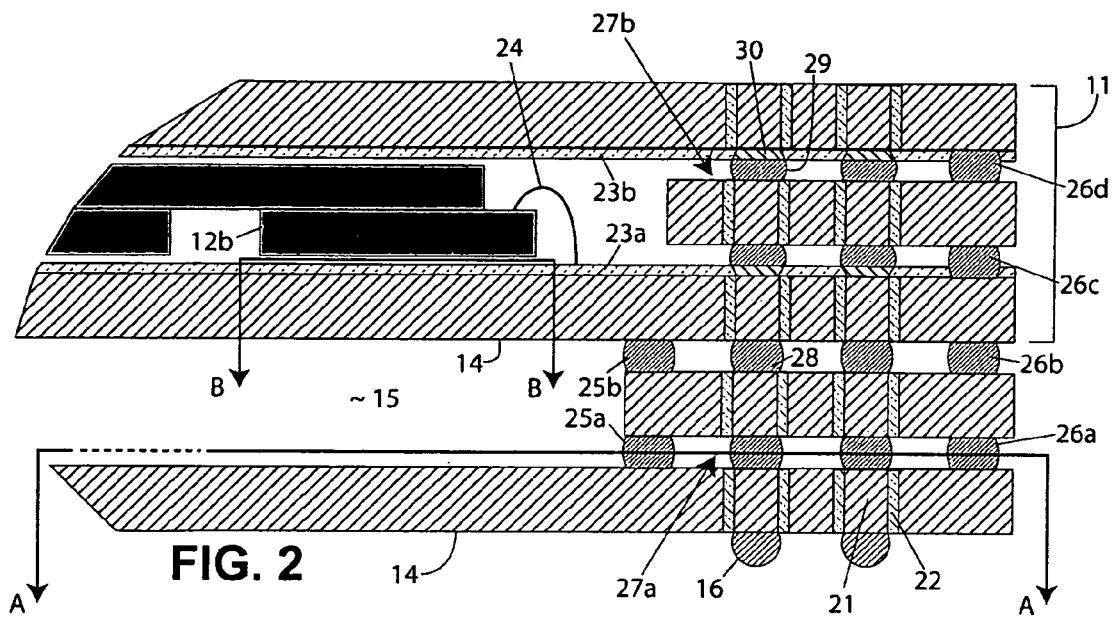
FIG. 2A is an enlarged cross-sectional view of region A of FIG. 1.

FIG. 2 is an expanded cross-sectional view of region A of FIG. 1. It details a portion of module 11, employing copper substrates 14. Cooling channel 15 is shown, and solder ball 16 of a BGA interface. Copper feedthrough 21 is isolated from copper substrate 14 by a glass seal 22, to be further described. IC chips such as 12b are mounted using a flip chip attachment to interconnection circuit 23a, to be further described. If the backside of a chip requires a bias voltage, it can be provided using a wire bond 24 to a corresponding pad on interconnection circuit 23a. Solder elements 25a and 25b are lines of solder that provide a hermetic seal at the edges of coolant channel 15. Similarly, solder elements 26a and 26b are lines of solder that seal at the outer edges of coolant channel layers, thus keeping feedthroughs like 27a dry. Solder elements 26c and 26d are also lines of solder; in this case their function is to keep the interior of module 11 dry. Feedthroughs like 27b within module 11 have a slightly different structure from feedthrough 27a. Solder bump 28 connects between two copper feedthroughs with no interconnection circuit present. Conversely, solder bump 29 connects to a trace on interconnection circuit 23b through a copper pad 30 embedded in the interconnection circuit. Note that interconnection circuits of the current invention include polymer dielectric layers that are not impervious to water; thus they are not present at the hermetic sealing elements.

Figure 3:
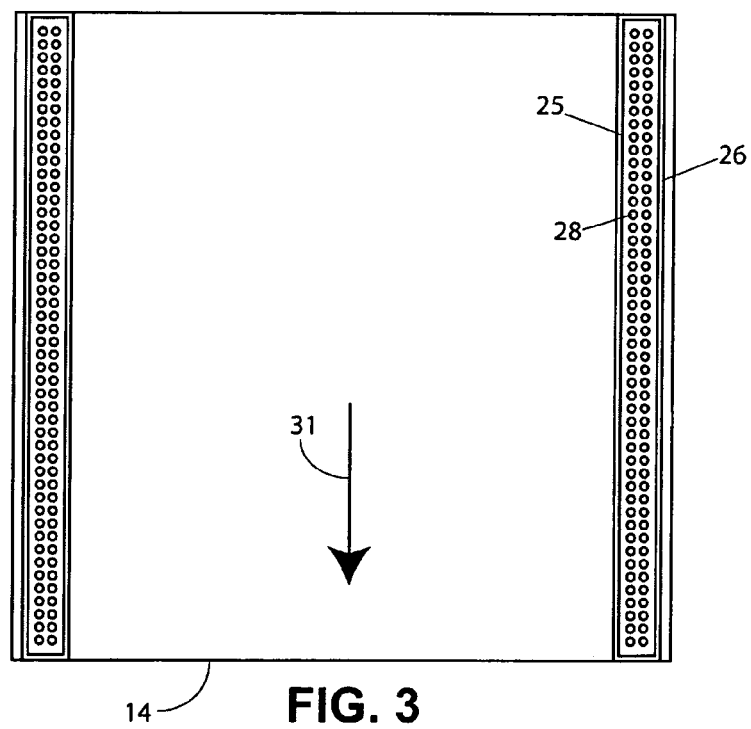
FIG. 3 is a cross-sectional view corresponding to section AA of FIG. 2.

FIG. 3 corresponds to section AA of FIG. 2. Copper base plate 14 is shown, together with solder features 25, 26, and 28 defined in FIG. 2. Coolant flow is unobstructed in the direction shown, 31.

Figure 4:
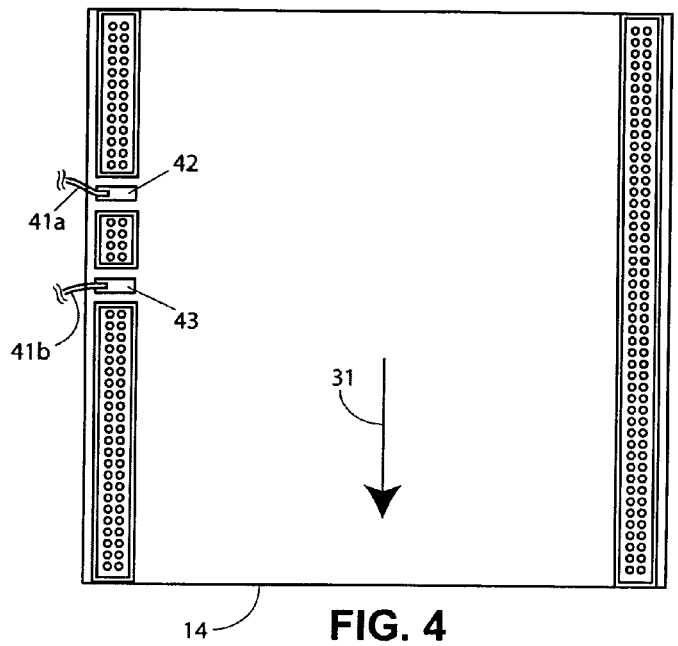
FIG. 4 is similar to FIG. 3, except some solder balls have been replaced with fiber optic connections.

FIG. 4 shows a variation of FIG. 3 wherein some of the solder bumps have been replaced with optical connections to increase the I/O bandwidth of module 11 of subsystem 10. Optical fibers 41a and 41b are shown. For example, circuit 42 may implement an optical receiver and circuit 43 may implement an optical transmitter. Again, coolant flow 31 is unobstructed.

Figure 5:
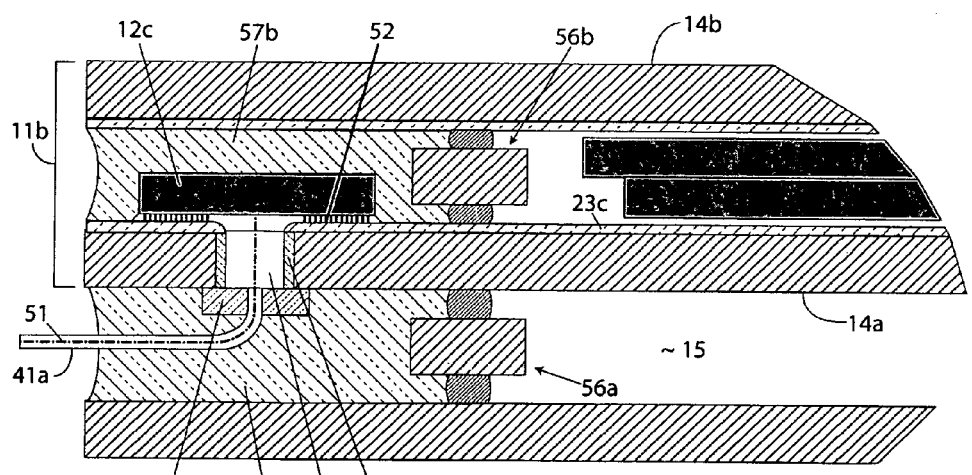
FIG. 5 shows an expanded cross-sectional view of a fiber optic connector of FIG. 4.

FIG. 5 illustrates in cross-section an expanded view of optical circuit 42 of FIG. 4, including optical fiber 41a and light path 51. Electro-optic chip 12c is directly attached to interconnection circuit 23c using PIW flip chip connectors 52, to be further described. For improved heat dissipation, chip 12c may be increased in height to provide cooling through the back face of the die to copper substrate 14b, or alternatively, a copper slug like 20 of FIG. 1 may be employed. A clear glass window 53 is provided in copper substrate 14a for transmitting light signal 51. Glass window 53 is sealed in substrate 14a using a glass seal 54, to be further described. An alignment cap 55 is used to position the end of fiber optic cable 41a in proper relation to electro-optic chip 12c. Hermetic structure 56a seals an edge of coolant channel 15, and hermetic structure 56b seals the complement of chips provided in subsystem 11b. Filler materials 57a and 57b are used to stabilize the structures after assembly; they are non-conducting and preferably good thermal conductors. A disadvantage of module 11b compared with module 11 of FIG. 1 is increased difficulty of rework, owing to the presence of filler 57b. Another disadvantage is the lack of a hermetic environment for electro-optic chip 12c. However, providing high bandwidth optical connections is important enough that these disadvantages may be acceptable.

Optical alignment of light path 51 with electro-optic chip 12c can be accomplished in two steps. First, the basic alignment accuracy of the PIW connectors is around ±5 μm. A performance parameter of the optical link (such as signal to noise ratio, SNR) is monitored while the solder is melted and the fine positioning of the chip attachment is optimized for link performance. The initial alignment and the fine-tuning feature depend on features of the PIW connector, to be further described.

Figure 6:
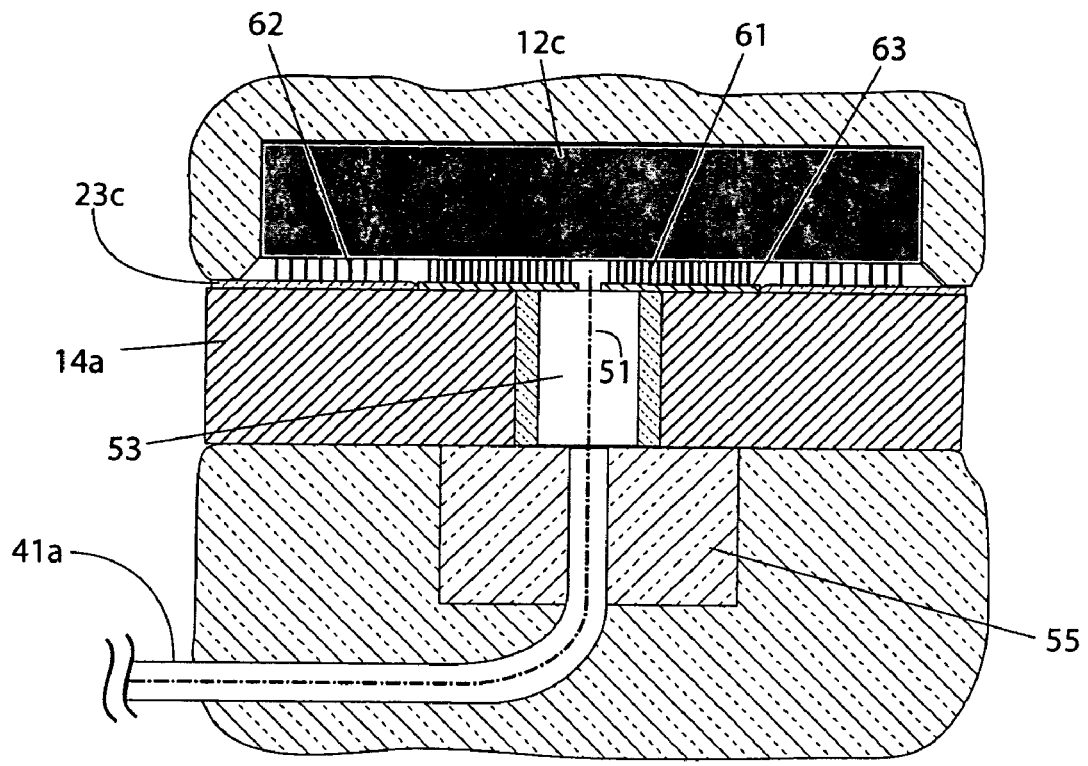
FIG. 6 shows in cross-section a further expanded view of a fiber optic connector that employs both heat bumps and I/O bumps.

FIG. 6 is a further expanded cross-sectional view of a preferred direct chip attachment of electro-optic chip 12c with interconnection circuit 23c. In FIG. 6 this attachment includes a combination of heat bumps 61 and input/output (I/O) bumps 62 as shown. The heat bumps are densely packed for maximum heat conduction and the I/O bumps are spaced apart to create separate electrical connections, to be further described. Heat bumps 61 terminate on a copper pedestal 63 while I/O bumps 62 terminate in interconnection circuit 23c.

Figure 7:
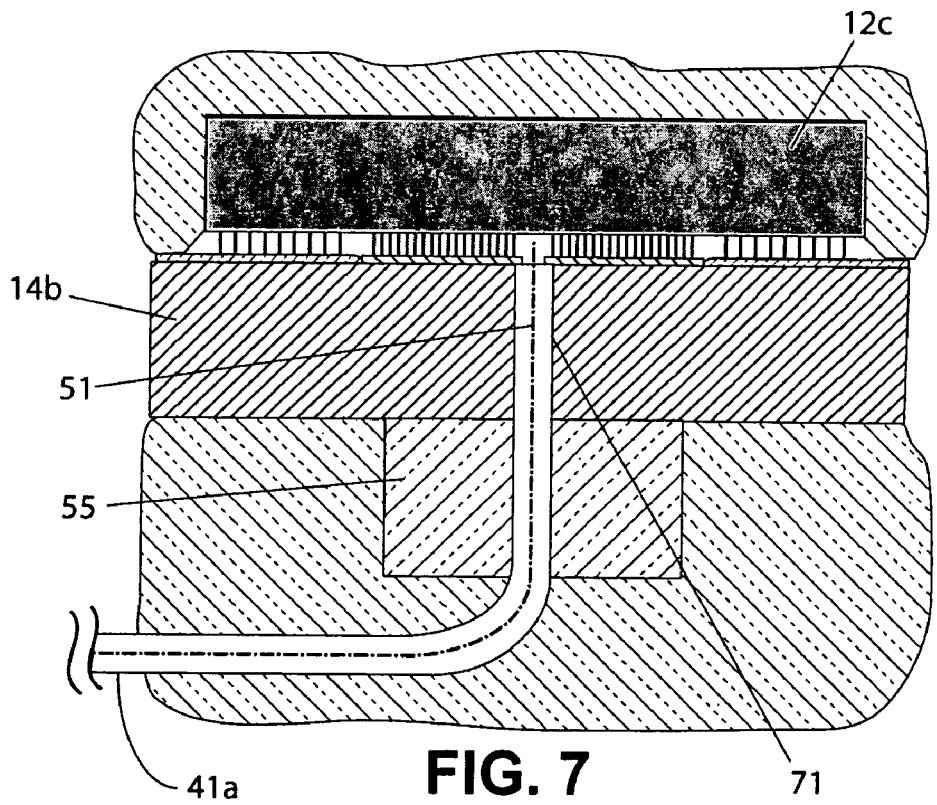
FIG. 7 depicts in cross-section a fiber optic connection that does not require a glass window.

FIG. 7 shows a variation on the fiber optic attachment depicted in FIG. 6. A precisely located and aligned hole 71 is provided in copper substrate 14b for capturing the end of optical fiber 41a while providing good alignment of light path 51 as it enters or exits from electro-optic chip 12c. As will be further described, the process used to machine copper substrate 14b can create alignment hole 71 with a placement accuracy of around ±1 μm using available milling machines. Using this placement accuracy together with a process for fine-tuning the optical alignment, as described in reference to FIG. 5, good optical alignment can be achieved while avoiding the cost of fabricating the clear glass window 53 shown in FIG. 6.

Figure 8:
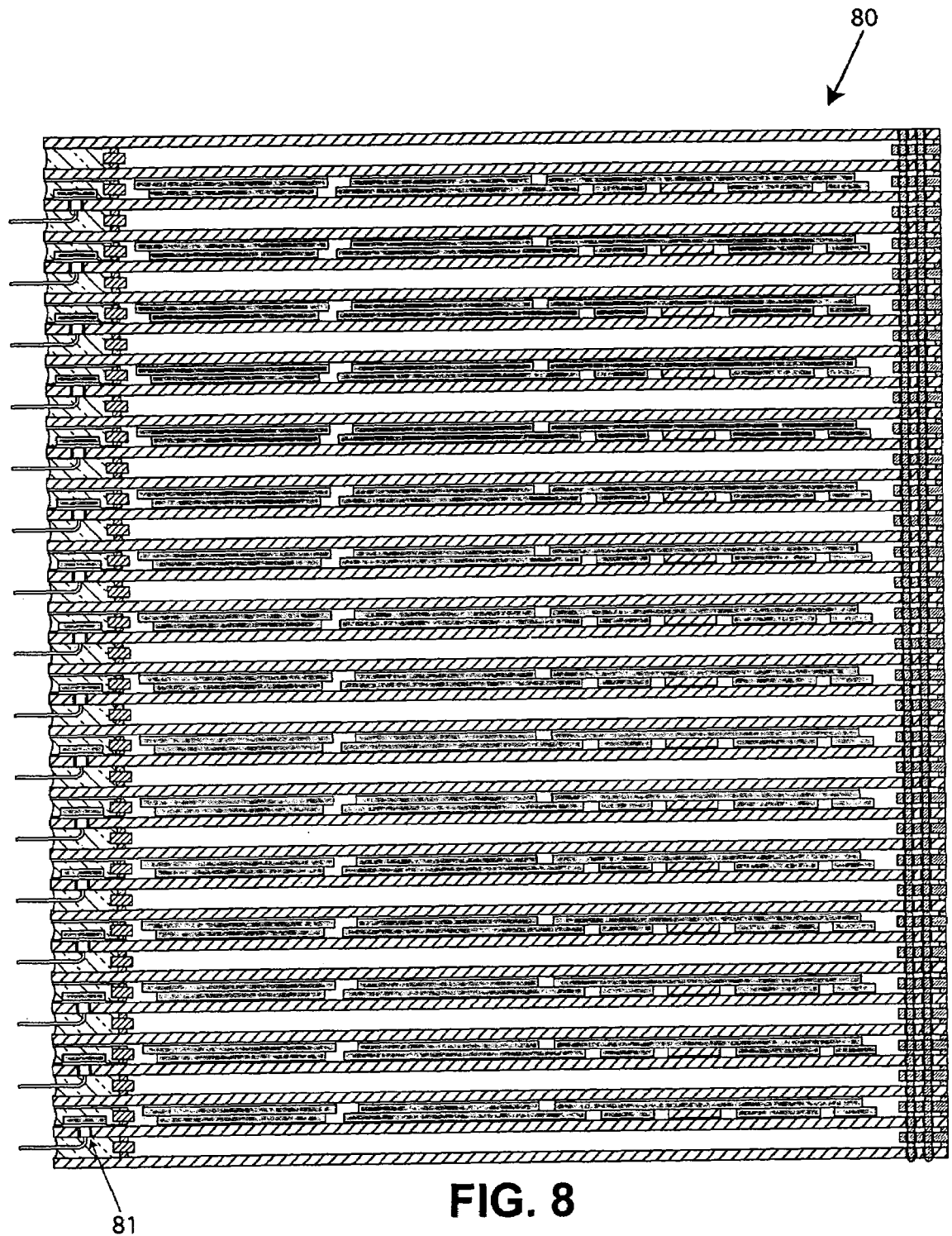
FIG. 8 shows in cross-section a stack of subsystems, with a fiber optic connection to each subsystem.

FIG. 8 shows a stacked subsystem architecture 80 of the current invention wherein each of the modules in the stack has a fiber optic connection 81 for increased I/O bandwidth.

Figure 9:
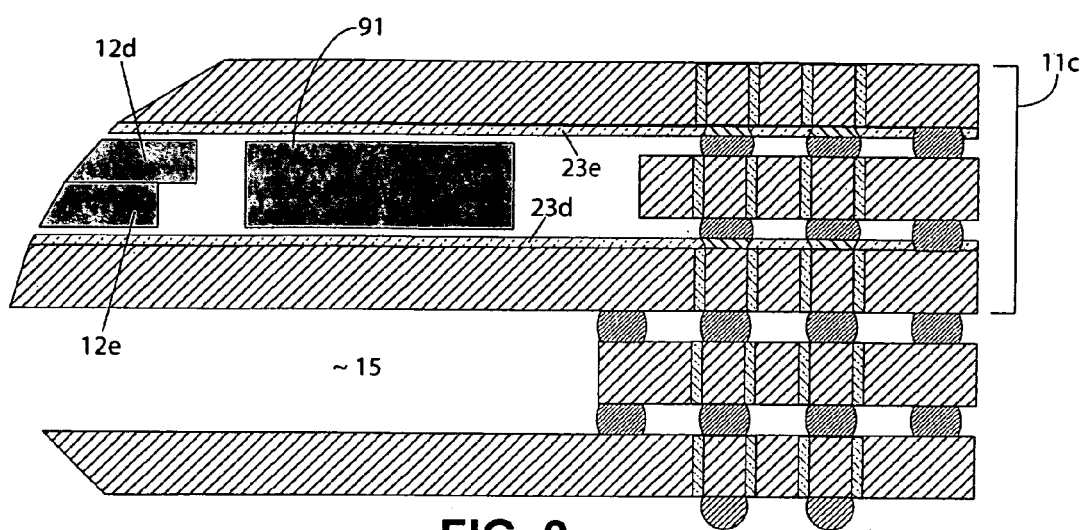
FIG. 9 illustrates in cross-section the use of a semiconductor plug device in a module.

FIG. 9 illustrates the use of a semiconductor plug 91 for communicating high bandwidth signals between interconnection circuits 23d and 23e of module 11c. Chips 12d and 12e are thinned to approximately one half of the thickness of plug 91 so that the different chips fit well together in module 11c as shown.

Figure 10:
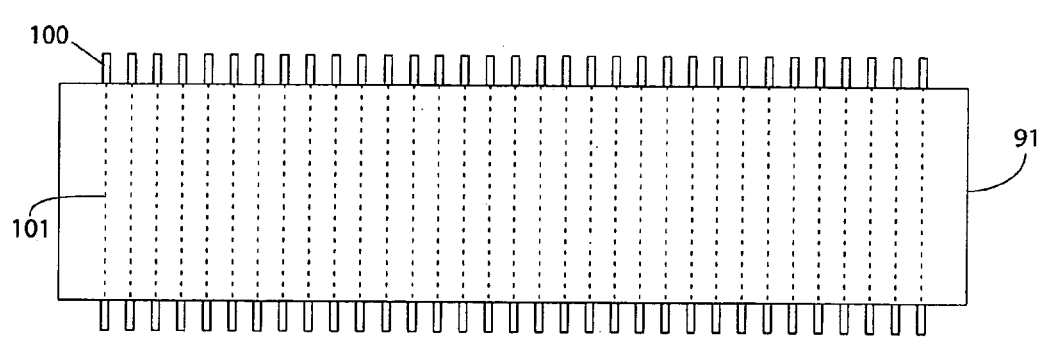
FIG. 10 shows an expanded schematic cross-sectional view of the plug device of FIG. 9.

FIG. 10 is a schematic representation of plug 91 including copper bump (pillar) element 100, and feedthrough element 101. Various methods are known in the art for creating feedthrough element 101 using either polysilicon or copper as the feedthrough conductor. Detailed features of bump element 100 will be further described.

Figure 11:
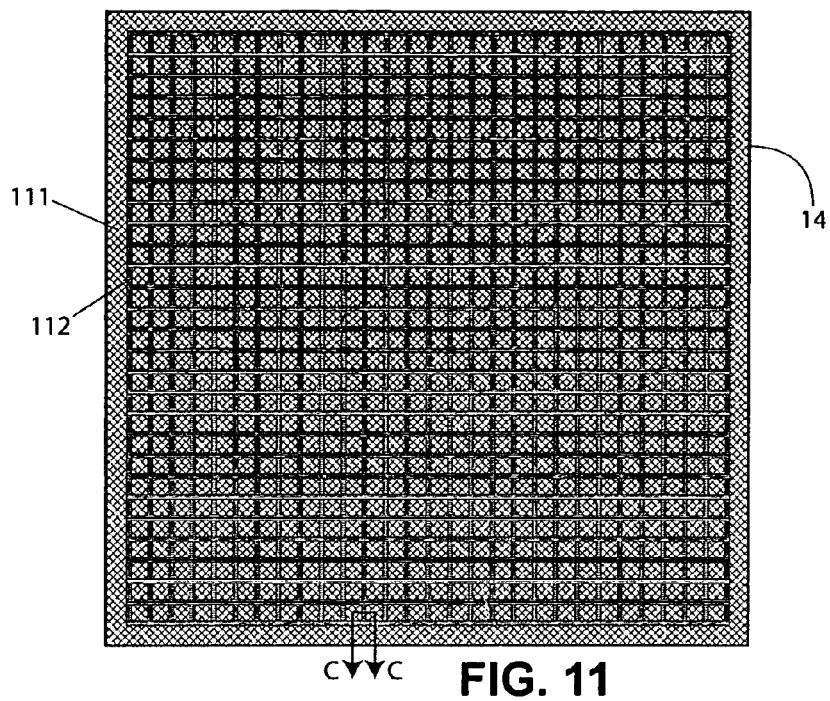
FIG. 11 is a schematic view of section BB of FIG. 2, showing an interface between a chip and a substrate that includes a mixed array of I/O bumps and heat bumps.

FIG. 11 corresponds to section BB of FIG. 2; it is a cross-section representing an interface between a chip and a substrate. A background array 111 of heat bumps is shown; it is comprised of copper columns that are closely spaced for maximum heat conduction and bend individually to relieve stress at the interface. I/O bumps are arrayed in rows and columns like 112; the I/O bumps are spaced apart and connect to substrate nodes individually, as will be further described. The layout shown in FIG. 11 represents a default or starting condition; it can be adjusted as required in response to routing issues and thermal issues. Note that the default layout shown in FIG. 11 provides a signal connector within a millimeter or two of any location on the chip; this means that signal path lengths can be short, aiding high frequency operation.

Figure 12:
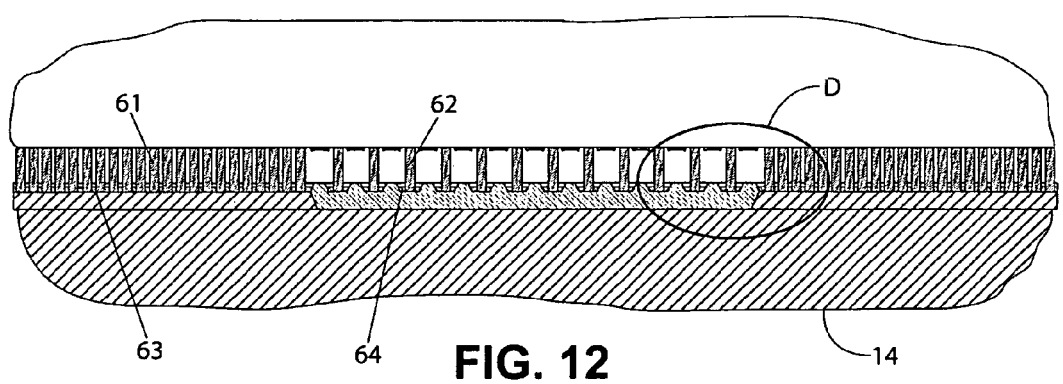
FIG. 12 is an expanded cross-sectional view of section CC of FIG. 11.

FIG. 12 is an expanded cross-sectional view corresponding to section CC of FIG. 11. Heat bumps 61 and I/O bumps 62 are shown. Heat bumps 61 terminate at the substrate in a common well 63 filled with conductive material. I/O bumps 62 terminate at the substrate in individual wells 64 filled with conductive material.

Figure 13:
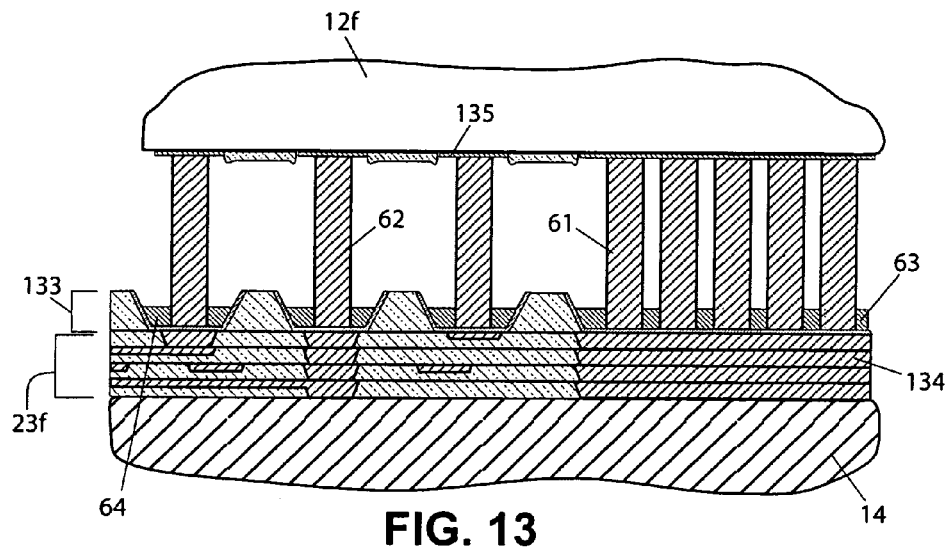
FIG. 13 is a further expanded cross-sectional view of Detail D of FIG. 12.

FIG. 13 is a further expanded cross-sectional view corresponding to Detail D of FIG. 12. Both heat bumps 61 and I/O bumps 62 are slender copper pillars that can flex to relieve stress at the interface. The bumps are anchored on pads 135 located on the front face (active side) of chip 12f. A preferred height-to-width ratio for both kinds of bumps is 5-10. A preferred height is 100 μm, because calculations show that around 32 μm of lateral translation is required at the edge of a large chip undergoing typical temperature cycles during manufacture; a height of 100 μm provides enough extension and flexibility to accommodate this motion. In addition to the lateral motion, about 6 μm of vertical translation is also required to relieve the interface stress, allowing an attached chip to remain flat; the columns are preferably flexible enough that they will bend or buckle as required to relieve this stress in the vertical direction. A preferred pitch for the I/O connectors is 80 μm, providing over 15,000 connectors per square centimeter. This density provides enough connectors for good localized power distribution. The extra connectors can also help to lower signal cross-talk, by surrounding each signal connector with a set of nearest-neighbor GND or DC power connections. A preferred pitch for the heat bumps is 30 μm, providing over 100,000 bumps per square centimeter. A suitable plating resist for achieving these geometries is Clariant Exp 100XT. It is a positive resist that is easily stripped after the copper columns are formed. The resist can be patterned with essentially vertical sidewalls at 100 μm thickness.

Common well 63 is provided for terminating the heat bumps at the substrate surface, and an individual well 64 for each I/O bump is shown. An example of an interconnection circuit 23f is shown. The well layer is shown as 133. Heat bumps 61 thermally connect with a copper pedestal 134 for maximum heat conduction from IC chip 12f to copper substrate 14. As will be further described, each bump originates at a pad like 135 on the chip. Note that bumps 61 and 62 combine mechanical, electrical, and thermal functions. Mechanically they provide structural support, stress relief, and compliant resistance to vibration and shock. Electrically they provide low inductance connectors estimated at 0.1 nH per bump/well combination; thus they will support digital signaling at around 20 Gbps and RF circuits operating at multi-gigahertz frequencies. Thermally they can dissipate heat flux ranging from 9 W/cm$^2$ for signal bumps alone, to 160 W/cm$^2$ for densely packed heat bumps, and to over 1,000 W/cm$^2$ when copper slugs like 20 in FIG. 1 are employed. These calculations assume a liquid coolant temperature of 10° C. and a maximum junction temperature of 85° C. Without resorting to the use of copper plugs, or using them only sparingly, subsystems like 10 of FIG. 1 can dissipate over 10 kW, while running efficiently and reliably. This multi-function performance can enable a new technology platform wherein digital and RF components are integrated using the same PIW connector. The preferred technology platform also includes copper substrates and high density interconnection circuits and test chips, to be further described.

Figure 14:
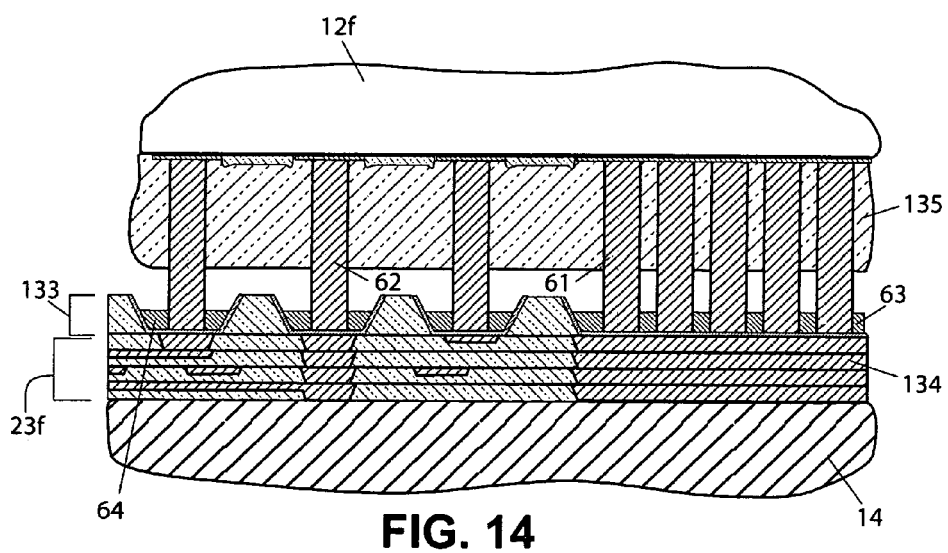
FIG. 14 is an expanded cross-sectional view showing the use of a damping layer.

FIG. 14 shows the use of a damping layer 135 of dielectric material such as polyimide, fabricated on chip 12f and substantially filling the space around pillars 61 and 62, except for ends of the pillars that are inserted into the wells. Damping layer 135 provides a compliant support structure that does not substantially interfere with the stress-relieving properties of the compliant pillars, yet provides additional protection against shock and vibration, and adds another thermally conductive path to aid in transporting heat between chip 12f and substrate 14.

This disclosure will now describe manufacturing processes for building the preferred modules and subsystems, along with a test method and a rework method for the stacked architecture.

Figure 15:
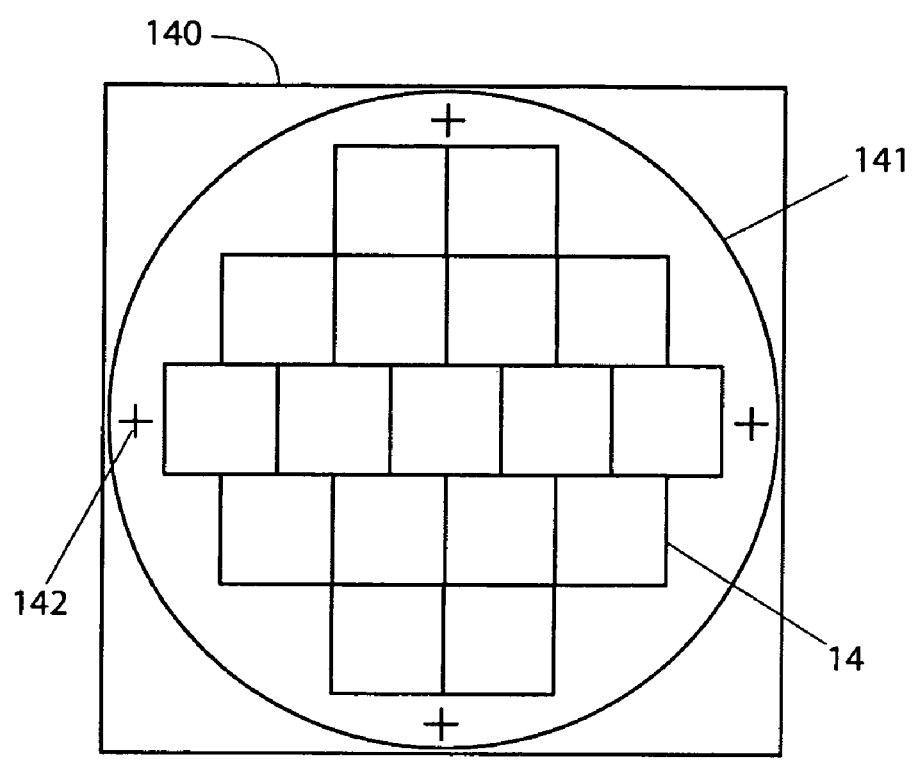
FIG. 15 is a top view of a square copper panel showing a layout of multiple copper substrates on a circular copper wafer to be separated from the square panel.

FIG. 15 is a top view of a square copper panel 140, preferably measuring 305×305×0.8 mm. Inscribed on panel 140 is a circular copper wafer 141 that is 300 mm in diameter. Inscribed within wafer 141 are seventeen copper substrates 14 measuring 50×50 mm. These dimensions take advantage of available fabrication equipment for processing 300 mm semiconductor wafers; however, any practical size of panel 140, wafer 141, and substrate 14 are included in the current invention. Alignment marks 142 are also provided; along with the wafer and substrate outlines they are inscribed (machined) into the copper surface during milling steps to be described.

Figure 16A:
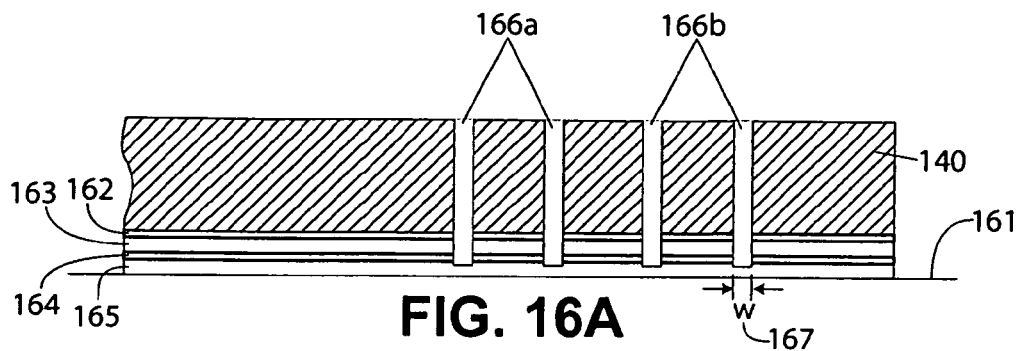
FIGS. 16A-16F depicts in cross-section a series of process steps for fabricating a hermetic copper substrate of the current invention having glass-isolated copper feedthroughs.

FIGS. 16A-16F illustrates a process sequence for fabricating isolated copper feedthroughs, starting with copper panel 140. FIG. 16A shows a vacuum hold-down surface 161 of a milling machine such as an H100 available from LPKF Laser and Electronics, Wilsonville, Oreg., USA. This machine spins the cutting tool at 100,000 RPM and is capable of milling tracks as narrow as 0.0031 inches or 80 μm. It also has a repetition accuracy of ±1 μm. Copper panel 140 of FIG. 15 is affixed to vacuum surface 161 using two mounting tapes that are pre-applied to the copper panel. The first tape is preferably a thermal release tape such as Revalpha available from Nitto Denko, Tokyo, Japan. It has a thermal release temperature of 150° C. for example. After removing its liner, this tape includes thermal release layer 162 (which is adhesive) and base polyester layer 163. The second applied tape has an adhesive layer 164 and a porous backing layer 165. After mounting copper panel 140 to vacuum surface 161 using the two mounting tapes, the milling tool is programmed to cut cylindrical cavities such as 166a and 166b that penetrate into porous layer 165 but do not interfere with vacuum surface 161. The preferred thickness of panel 140 is 0.8 mm and the preferred cavity width, w 167, is 0.1 mm.

Figure 16B:
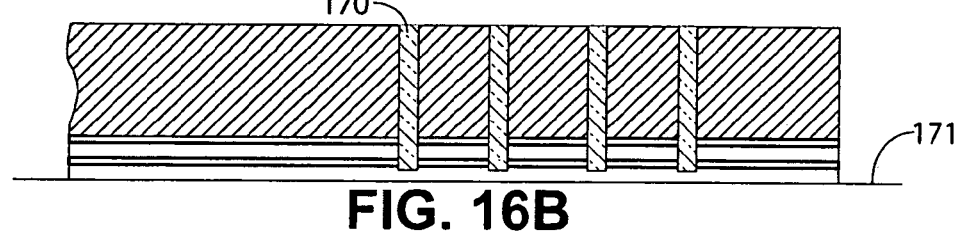

FIG. 16B shows the effect of screening a glass frit material 170 into the machined cavities. This process is preferably performed using a vacuum table 171, which will help fill the cavities to the bottom.

Figure 16C:
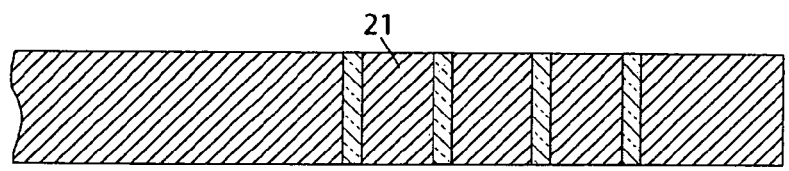

FIG. 16C shows the result of activating the thermal release layer and removing both of the tapes from the back side of copper panel 140. The stiffness of the screened frit material is adequate to hold copper feedthroughs 21 in position while both mounting tapes are released using a hotplate.

Figure 16D:
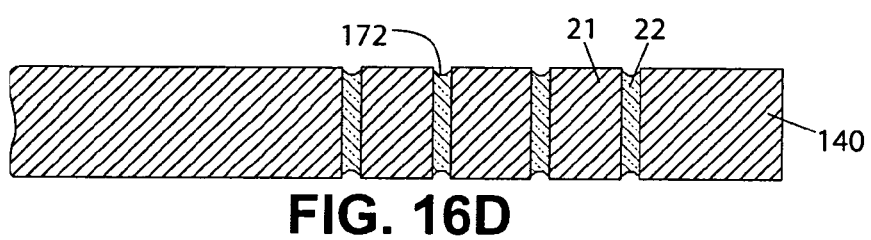

FIG. 16D shows the result of firing the glass frit to form glass seals 22 around copper feedthroughs 21, as first defined in FIG. 2. An inert atmosphere is used for this firing at around 550° C., to prevent excessive oxidation of base copper panel 140. The screened frit material will reduce in volume when fired, forming a cupped surface 172 as shown. Copper wafer 141b will be separated from the copper panel 140 using the milling tool, employing alignment marks 142 previously described in reference to FIG. 15. Chemical mechanical polishing (CMP) will be applied as is known in the art, to polish the separated copper wafer to a final preferred thickness of 0.6 mm.

Figure 16E:
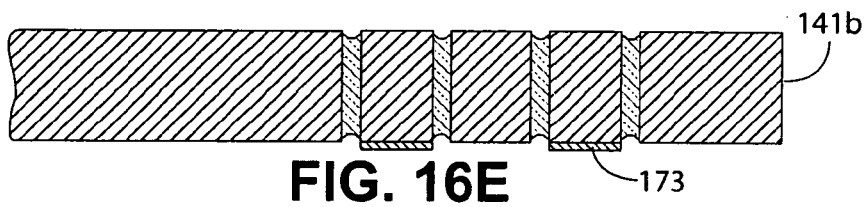

FIG. 16E shows an under bump metallization (UBM) 173 applied to the copper feedthroughs as shown. UBMs are known in the art; a typical formulation includes a thin titanium layer for adhesion, nickel as a diffusion barrier, and gold to provide a solder wetting surface.

Figure 16F:
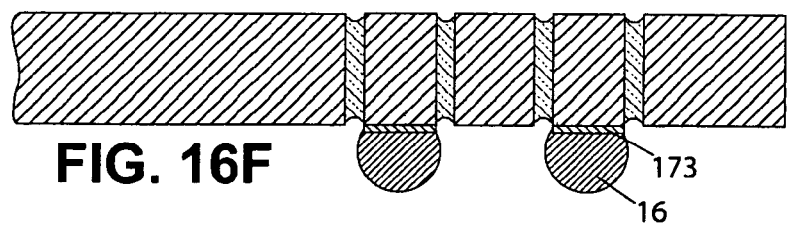

FIG. 16F shows copper substrate 14 with solder balls 16 formed on UBM layer 173. Since the solder balls would prevent vacuum hold-down on chucks used for processing the interconnection circuits on copper wafer 141b, process steps described in relation to FIGS. 16E and 16F are delayed until the interconnection circuits are completed. The solder balls may be formed using wafer level stencil printing, jetting processes, or electroforming, all known in the art. When the deposited solder alloy is heated to melting, it is pulled into a spherical shape by surface tension. After bumping wafer 141b with solder balls, it can be separated into individual module substrates 14 using the milling tool previously described.

Figure 17A:
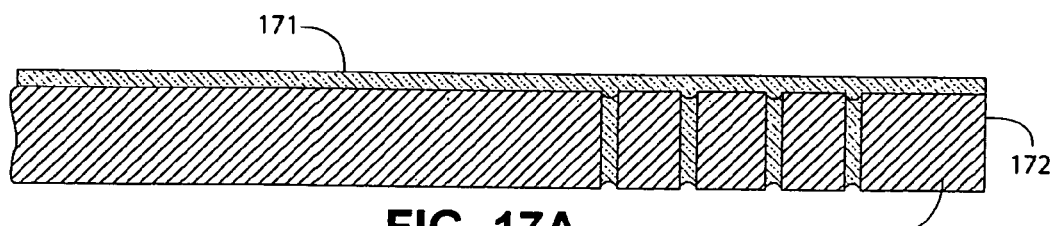
FIGS. 17A-17P depicts in cross-section a series of process steps for fabricating a 5-layer interconnection circuit plus and a well layer on the copper substrate of FIG. 15D, and also forming a solder ball at each feed through, and assembling a chip on the interconnection circuit.
Figure 17B:
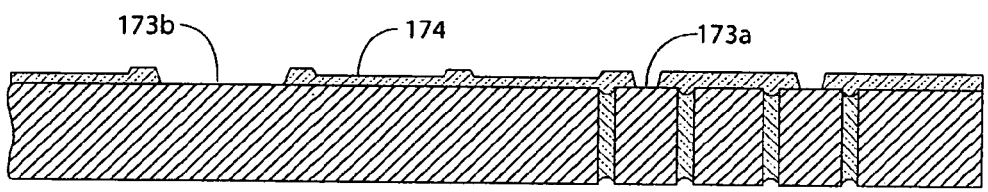
Figure 17C:
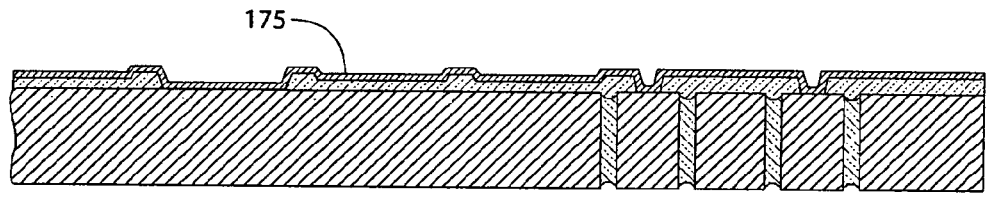
Figure 17D:
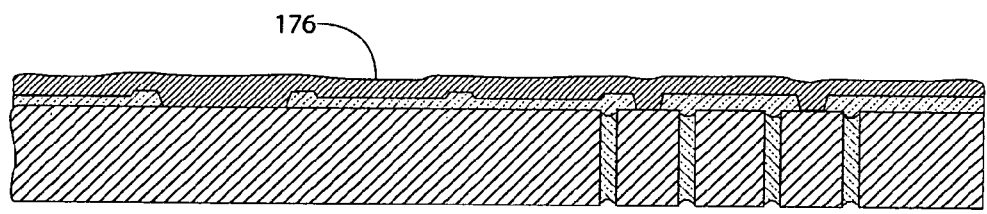
Figure 17E:
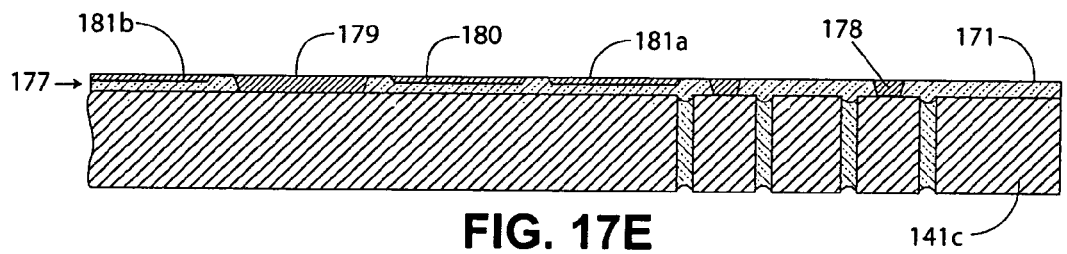
Figure 17F:
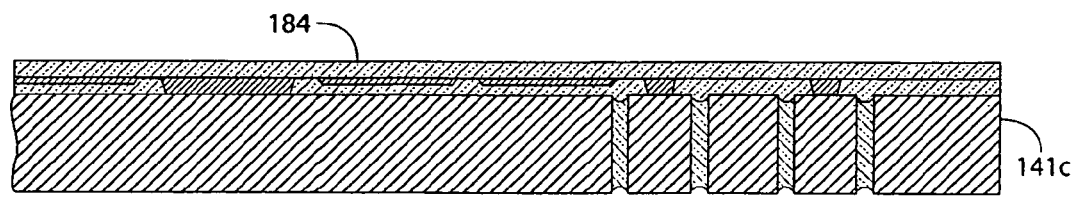
Figure 17G:
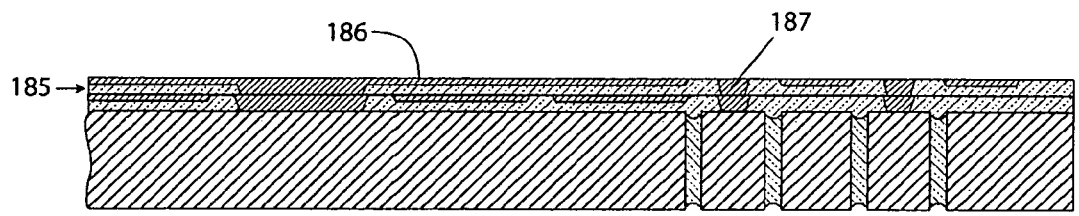
Figure 17H:
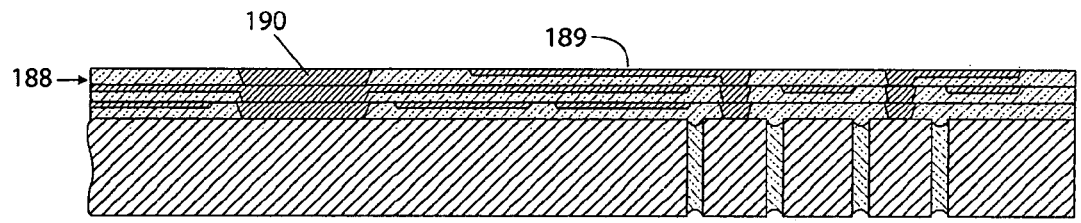
Figure 17I:
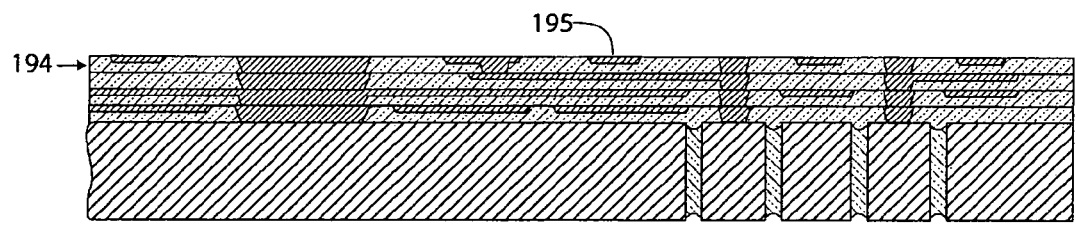
Figure 17J:
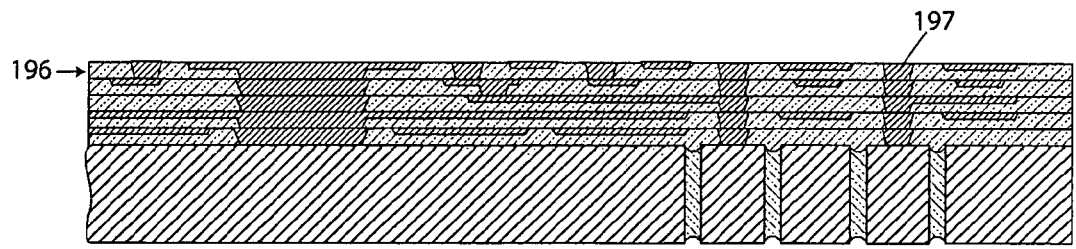
Figure 17K:
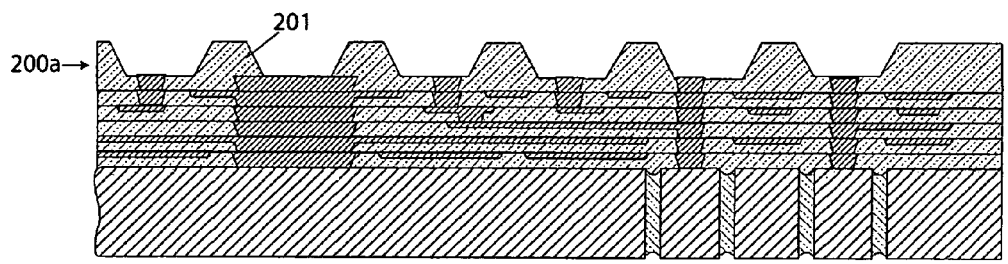
Figure 17L:
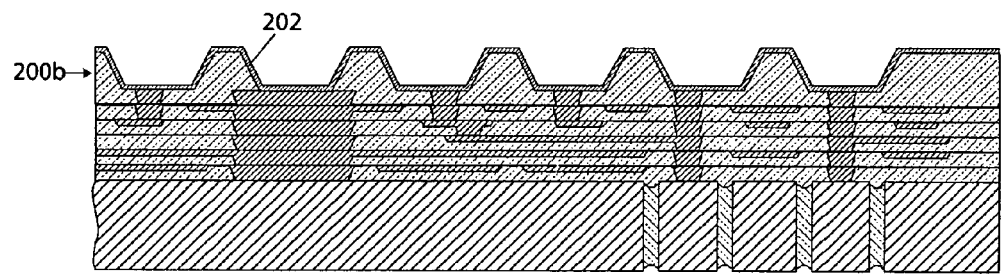
Figure 17M:
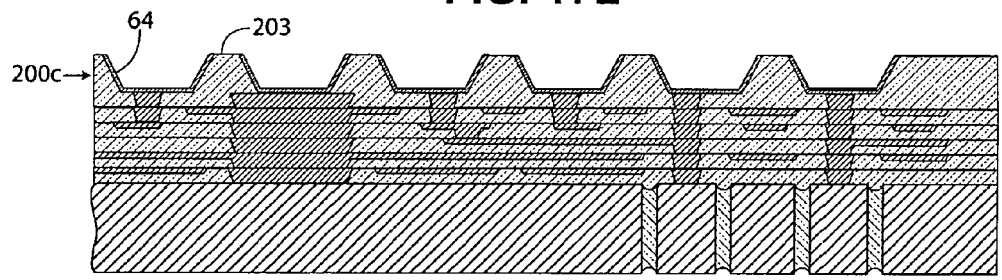
Figure 17N:
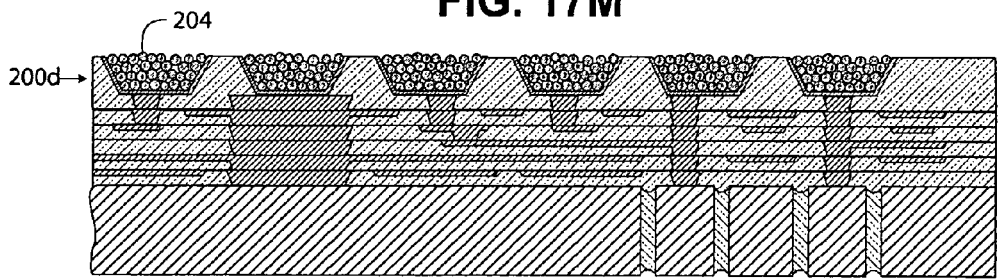
Figure 17O:
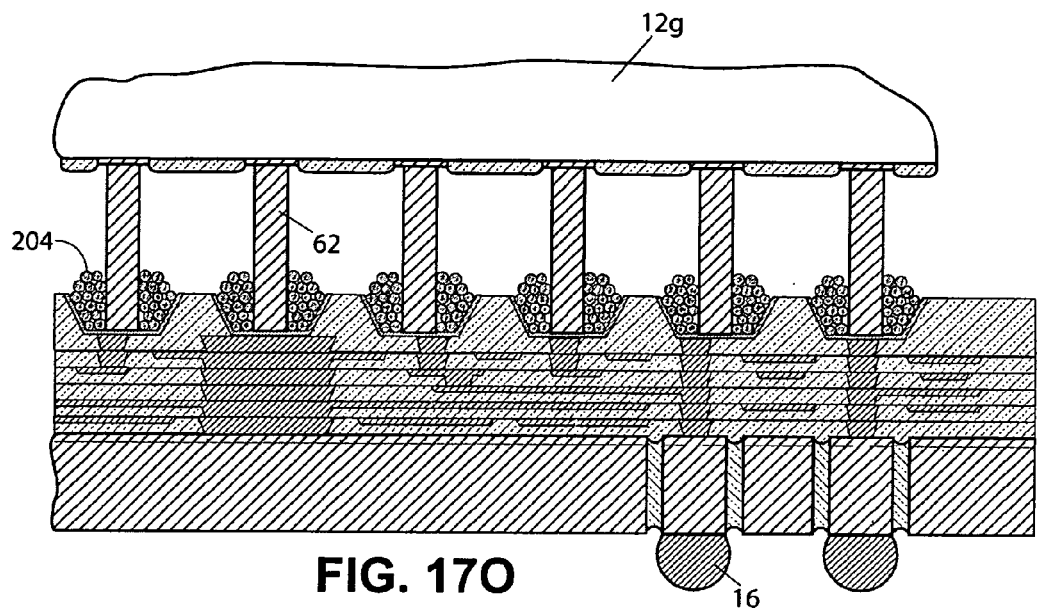
Figure 17P:
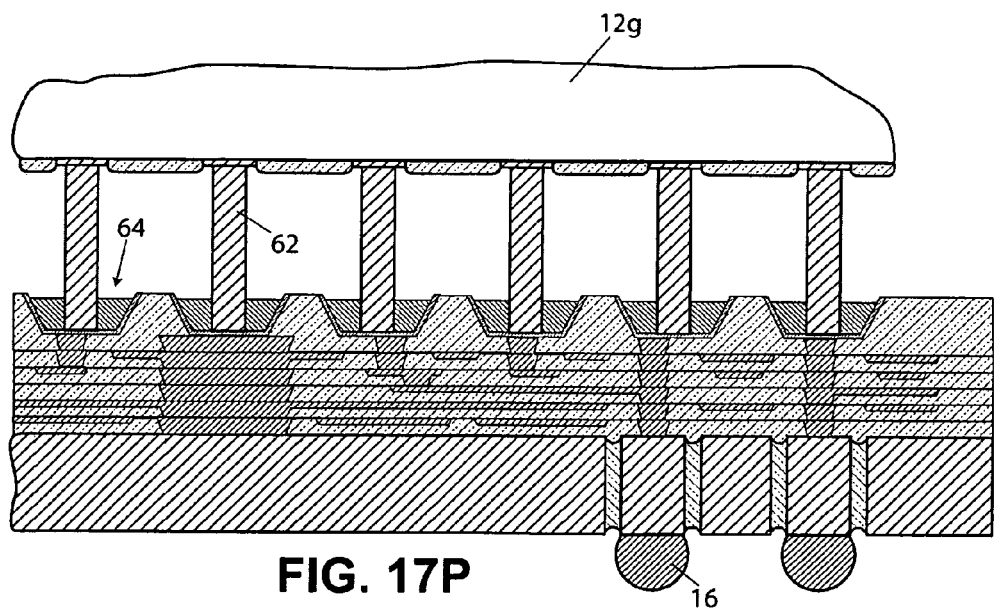

FIGS. 17A-17P illustrates a process sequence for fabricating interconnection circuits and a well layer on a copper wafer. FIGS. 17A-17E teaches the base processes for fabricating a single dual damascene copper layer, of which five are included in the preferred embodiment of the current invention. For visual reference in FIGS. 17A-17P an edge 172 is shown, although this edge is not created until wafer processing is completed and substrates 14 are separated from wafer 141c.

FIG. 17A shows the result of spin coating copper wafer 141c with a preferred spin-on dielectric (SOD) material 171 called BCB (benzocyclobutene), which is well known in the industry. Polyimide may be used in place of BCB. The preferred thickness is approximately 8 µm.

In FIG. 17B, layer 171 of BCB has been patterned using dual damascene processes, forming via features 173a and 173b, and also trace features 174. Either photolithographic methods or the imprinting method may be used to achieve this result; both are known in the art.

FIG. 17C shows the result of sputter deposition of a seed layer of copper 175, typically using a thin layer of titanium for adhesion to the underlying BCB.

In FIG. 17D, the copper seed layer has been electroplated, terminating in an uneven surface 176.

FIG. 17E shows the result of polishing the surface of wafer 141c using CMP methods known in the art. Power trace layer 177 is complete, including vias 178 and 179, also traces 180. In the preferred embodiment, this layer provides GND plus two power supplies, delivered using via/trace 179 and traces 180a and 181a respectively. These power traces repeat across the substrate surface, and trace 181b delivers the same voltage as 181a. For the special case of the power trace layer 177 depicted in FIG. 17E, embedded capacitance may be valuable for bypassing each power supply to GND. Consequently, a high dielectric material may be used for layer 171 instead of BCB or polyimide. This embedded capacitance technique is also known in the art.

FIG. 17F shows that a new layer 184 of SOD material has been applied to wafer 141c, in preparation for fabrication of a second dual damascene copper interconnect layer.

FIG. 17G shows completed second layer 185 which is a GND layer, to support a transmission line structure for the subsequent signal layer, as is known in the art. Layer 185 includes ground conductors 186 and feedthrough vias 187.

FIG. 17H depicts first signal layer 188, including traces 189 that preferably run in the x-direction. Signal traces are routed around the power and GND vias.

FIG. 17I shows second signal layer 194, including traces like 195 that preferably run in the y-direction.

FIG. 17J illustrates layer 196, including vias 197 that will connect with wells, to be fabricated next.

FIG. 17K illustrates a patterned dielectric layer 201, preferably around 20 µm thick, forming the well shapes for a well layer, 200a.

In FIG. 17L, well layer 200b includes sputter deposited Ti/Au 202 that physically and electrically connects with the underlying copper structures. An outer covering of gold is required for compatibility with the preferred 80Au20Sn solder paste. For reliable solder connections, the Au layer must be at least 1000 Angstroms thick.

FIG. 17M shows the result of CMP to remove the Ti/Au thin films in field areas 203, providing electrical isolation between the wells in layer 200c.

In FIG. 17N, layer 200d shows that the wells have been filled with fine conductive particles 204. The preferred particles are made from a gold-tin alloy, 80Au20Sn. The preferred particle diameter is smaller than 4 µm, for easy filling of the wells 64. 80Au20Sn alloy is lead-free, and has a successful history as a high-reliability solder. Any oxide tarnish on the particles can be removed by dipping in dilute hydrochloric acid; thus providing a flux-free solder. The wells are filled by pouring the conductive powder over the substrate surface to fill all of the wells, then applying and removing a sheet of adhesive to the substrate surface to remove loose particles adhering to areas 203 between the wells.

FIG. 17O shows the result of aligning an IC chip 12g with the substrate containing the wells, bringing them together, and pushing gently on chip 12g so that the pillars 62 penetrate the powder in the wells. For fragile chips such as ones using delicate low-k dielectrics, it may be desirable to apply ultrasonic shaking, so that the pillars enter the powder in the wells using only gravity as a pushing force. The alignment process is known in the art: a precision flip chip aligner using split beam optics can achieve alignment accuracy of around ±2 µm. 80Au20Sn is reported to have tensile strength and shear strength of 40,000 PSI, the highest of commonly available solders. This strength is advantageous for capturing the ends of copper bumps 62 in wells 64 firmly under mechanical stress conditions such as occur during temperature cycling or shock conditions.

FIG. 17P shows the result of melting and flowing the 80Au20Sn solder at approximately 320° C.; the volume of solder shrinks slightly.

Figure 18:
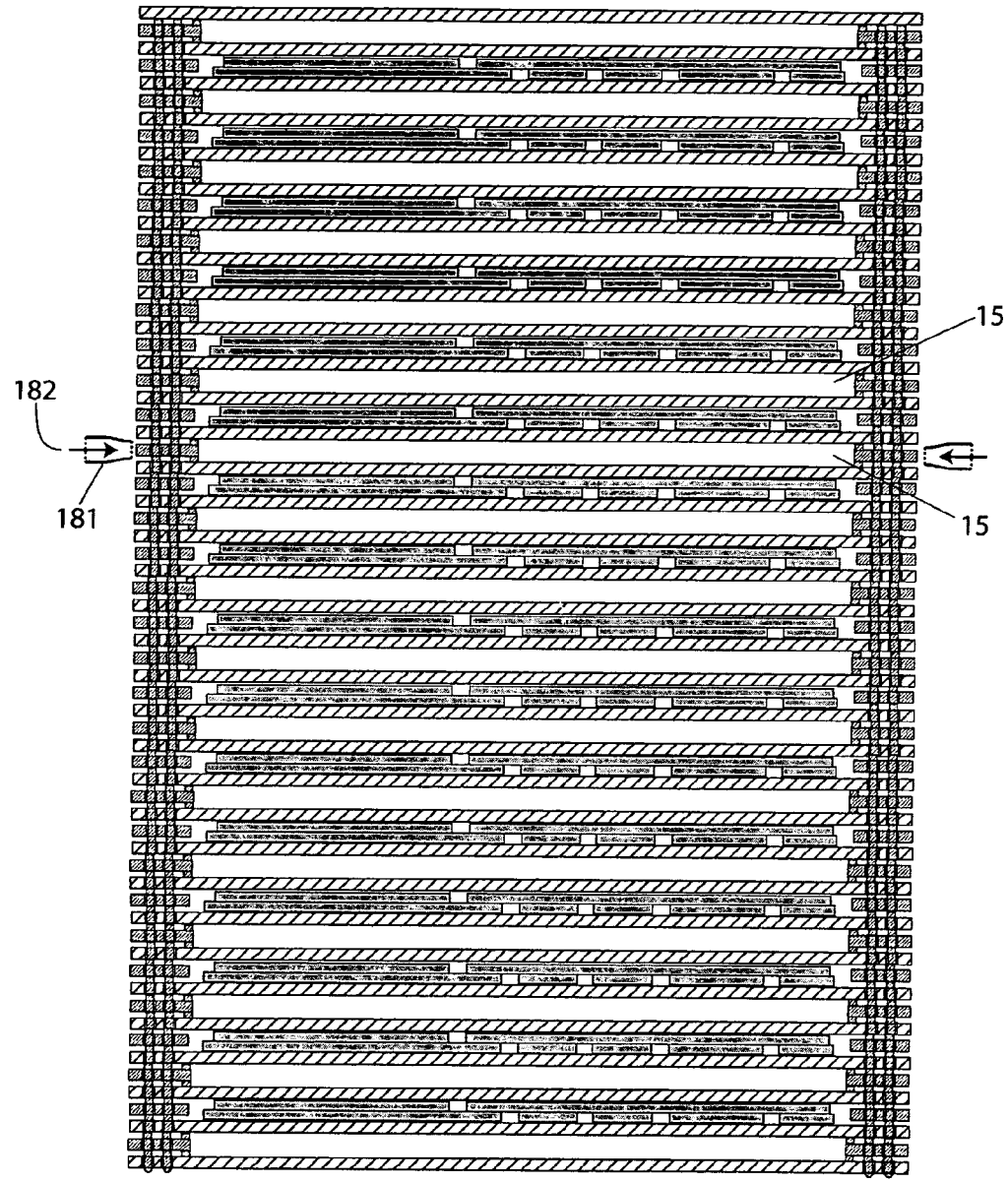
FIG. 18 shows a subsystem stack in cross-section, including a directed source of hot inert gas for removing a defective module.

In the event that a large subsystem like 10 of FIG. 1 begins to fail, some disassembly may be required. The resident test chips can be used to isolate which of the modules is defective and needs replacement or repair. FIG. 18 shows schematically how the nozzles of a rework device can direct jets of hot inert gas selectively at a particular set of feedthroughs in the stack. Soldered joints at the chosen level in the stack will melt, allowing disassembly. This process may be aided by flowing hot inert gas through adjacent cooling channels 15. It is preferable to suck out any solder remaining at the interface and replace it with new solder on the replacement parts. The new solder is reflowed to semi-permanently install the replacement module. Defective modules can be repaired by re-working defective chips using the process previously described in relation to PIW connectors.

A stacked 3D electronic subsystem has been described. It can achieve a miniaturization factor of over 100 compared with equivalent assemblies using current technology, yet it can be well-tested, repairable, and adequately-cooled. The described methods can be applied to increase performance and reduce cost in assemblies as small as cell phones and as large as supercomputers.

The invention claimed is:

1. An electronic subsystem comprising:
a first stackable module including:
   a first substrate having first and second surfaces and a first conductive feedthrough extending between the first and second surfaces;
   an integrated circuit mounted on the first substrate;
   a second substrate having first and second surfaces and a second conductive feedthrough extending between the first and second surfaces of the second substrate, the second conductive feedthrough electrically coupled to the first conductive feedthrough;
   a cooling channel beneath the first substrate, the cooling channel defined by the first and second substrates;
an interconnector electrically coupled to the first and second conductive feedthroughs, the interconnector forming the electronic subsystem by permitting the first stackable module to couple to an additional stackable module; and
a ball grid array interface coupled to the interconnector for communication with the first and second stackable modules.

2. The electronic subsystem of claim 1 wherein the interconnector includes a solder connection, and the electronic subsystem includes a second stackable module connected to the interconnector.

3. The electronic subsystem of claim 1 wherein the stackable module includes a connection to an optical fiber for high bandwidth communications.

4. The electronic subsystem of claim 1 wherein said stackable module includes a copper substrate.

5. The electronic subsystem of claim 1 wherein said module includes direct chip attachments between the integrated circuit and the first substrate employing flip chip connectors.

6. An electronic subsystem comprising:
a first stackable module including:
   a first substrate having first and second surfaces and a first conductive feedthrough extending between the first and second surfaces;
   an integrated circuit mounted on the first substrate;
   a second substrate having first and second surfaces and a second conductive feedthrough extending between the first and second surfaces of the second substrate, the second conductive feedthrough electrically coupled to the first conductive feedthrough;
   a cooling channel beneath the first substrate, the cooling channel defined by the first and second substrates; and,
an interconnector including a pillar for pillar in well connectors, the interconnector electrically coupled to the first and second conductive feedthroughs, the interconnector forming the electronic subsystem by permitting the first stackable module to couple to an additional stackable module.

7. An electronic subsystem comprising:
a first stackable module including:
   a first copper substrate having first and second surfaces and a first glass-sealed copper feedthrough extending between the first and second surfaces;
   an integrated circuit mounted on the first substrate;
   a second copper substrate having first and second surfaces and a second glass-sealed copper feedthrough extending between the first and second surfaces of the second substrate, the second glass-sealed copper feedthrough electrically coupled to the first glass-sealed copper feedthrough;
   a cooling channel beneath the first substrate, the cooling channel defined by the first and second substrates; and,
an interconnector electrically coupled to the first and second glass-sealed copper feedthroughs, the interconnector forming the electronic subsystem by permitting the first stackable module to couple to an additional stackable module.

8. The electronic subsystem of claim 7 wherein interconnection circuits are fabricated on said copper substrate.

9. A re-workable and well-cooled electronic subsystem comprising:
integrated circuit chips attached to stackable modules using re-workable flip chip connectors, each of which include a conductive bump or pillar inserted into a well filled with conductive material;
spacers providing electrical feed throughs and a sealed cooling channel between each of said stackable modules;
coolant flowing in said cooling channels; and,
solder connections between said modules and said spacers in said stack that are accessible to directed jets of hot inert gas for melting said solder in selected ones of said connections for performing said rework of said subsystem.

10. The electronic subsystem of claim 9 wherein said conductive material is a conductive powder.

11. The electronic subsystem of claim 10 wherein said conductive powder includes particles of alloy 80Au20Sn.

12. The electronic subsystem of claim 9 wherein said conductive material includes a solder.

13. The electronic subsystem of claim 9 wherein said bumps or pillars have a height to width ratio of 2.5-10, providing a mechanically compliant interface.

14. The re-workable subsystem of claim 9 wherein said integrated circuit chips include a plurality of circuit types selected from digital, analog, RF, optical, electro-optical, and integrated passives.

15. The re-workable subsystem of claim 9 wherein said stackable modules are hermetic.

* * * * *